(12) United States Patent
Mauney

(10) Patent No.: US 11,585,865 B2
(45) Date of Patent: Feb. 21, 2023

(54) TRANSFORMER FAULT DETECTION SYSTEM

(71) Applicant: S&C Electric Company, Chicago, IL (US)

(72) Inventor: Marshall Mauney, West Bend, WI (US)

(73) Assignee: S&C Electric Company, Chicago, IL (US)

( * ) Notice: Subject to any disclaimer, the term of this patent is extended or adjusted under 35 U.S.C. 154(b) by 83 days.

(21) Appl. No.: 17/148,734

(22) Filed: Jan. 14, 2021

(65) Prior Publication Data

US 2021/0215772 A1    Jul. 15, 2021

Related U.S. Application Data

(60) Provisional application No. 62/961,008, filed on Jan. 14, 2020.

(51) Int. Cl.
     *G01R 31/62*      (2020.01)
     *G01R 19/165*     (2006.01)

(52) U.S. Cl.
     CPC ....... *G01R 31/62* (2020.01); *G01R 19/16566* (2013.01)

(58) Field of Classification Search
     CPC ..... G01R 31/62; G01R 19/16566; H04B 1/04
     See application file for complete search history.

(56) References Cited

U.S. PATENT DOCUMENTS 5,396,172 A * 3/1995 Lat .................. G01R 31/62
                                                                              324/547
5,625,539 A * 4/1997 Nakata ............. H02M 7/4807
                                                                              363/17
2009/0002137 A1    1/2009   Radtke
2010/0188240 A1    7/2010   Wells
2012/0158325 A1*   6/2012   Banerjee ................. G01R 29/20
                                                                                   702/58
2013/0282312 A1    10/2013   Abeywucjrama et al.
2014/0191774 A1    7/2014   Muller
2017/0227594 A1    8/2017   Zhang et al.
2017/0370794 A1*   12/2017   Piper ..................... H01F 27/402
2019/0277898 A1    9/2019   Beaudet et al.

OTHER PUBLICATIONS

International Search Report and Written Opinion for International Application No. PCT/US2021/013349 dated Apr. 21, 2021. (13 pages).

* cited by examiner

*Primary Examiner* — Jeff W Natalini

(57) ABSTRACT

A transformer fault detection, where the transformer includes a primary winding coupled to a medium voltage power line and a secondary winding providing a stepped down voltage of the medium voltage. The detection system includes a switching device, where the switching device includes a first voltage measuring device for measuring the voltage on the primary winding, a controller for processing measured voltages and a transceiver for receiving and transmitting messages. The detection system also includes a second voltage measuring device for measuring the stepped down voltage on the secondary winding, where the second voltage measuring device includes a transmitter for transmitting the measured step down voltage to the switching device. The controller uses the measured voltages to calculate a transformer turns ratio (TTR) of the transformer to determine whether a transformer fault.

16 Claims, 2 Drawing Sheets

TRANSFORMER FAULT DETECTION SYSTEM

CROSS-REFERENCE TO RELATED APPLICATION

This application claims the benefit of priority from the U.S. Provisional Application No. 62/961,008, filed on Jan. 14, 2020, the disclosure of which is hereby expressly incorporated herein by reference for all purposes.

BACKGROUND

Field

This disclosure relates generally to a transformer fault detection system for determining whether a distribution transformer requires replacement.

Discussion of the Related Art

An electrical power distribution network, often referred to as an electrical grid, typically includes a number of power generation plants each having a number of power generators, such as gas turbines, nuclear reactors, coal-fired generators, hydro-electric dams, etc. The power plants provide power at a variety of medium voltages that are then stepped up by transformers to a high voltage AC signal to be connected to high voltage transmission lines that deliver electrical power to a number of substations typically located within a community, where the voltage is stepped down to a medium voltage for distribution. The substations provide the medium voltage power to a number of three-phase feeders including three single-phase feeder lines that carry the same current, but are 120° apart in phase. A number of three-phase and single-phase lateral lines are tapped off of the feeder that provide the medium voltage to various distribution transformers, where the voltage is stepped down to a low voltage and is provided to a number of loads, such as homes, businesses, etc.

The medium voltage power in these types of power distribution networks is stepped down to a low voltage by electrical distribution transformers strategically positioned along the lateral lines, and the low voltage is then provided to a number of loads, such as homes. These distribution transformers typically have an outer housing that is filed with oil that operates as a dielectric medium and a coolant for current flow in the primary and secondary windings of the transformer. These distribution transformers are often operated without maintenance for very long periods of time, possibly up to several decades. However, as with all things, these transformers will eventually reach and end of useful life. One common end-of-life mode of a transformer of this type occurs as a result of the breakdown of paper insulation on and around the wires in the primary and secondary windings in the transformer that creates a short circuit and usually initiates cascading short circuits between adjacent turns in the windings of the transformer. This cascading short circuit process creates additional current flow that causes the transformer to overheat potentially leading to an extended power outage and may risk property damage or injury to bystanders.

Therefore, utility companies employ various techniques to monitor the degradation and decline of distribution transformers in an attempt to replace them before they reach end-of-life. These techniques usually require a visual inspection of the transformer where a crew goes to each transformer and views visual indicators, such as pop-up valves showing an increased pressure within the transformer as a result of increased temperature, or by using an infrared camera to detect increases in temperature of the transformer. However, the cascading short circuit referred to above can happen relatively quickly and because there are many, many such transformers in service for a typical utility, the ability to identify a faulty transformer in a sufficient time to act is reduced.

A side effect of the cascading breakdown of a transformer because of winding shorts is a change in the observed transformer turns ratio (TTR) of the transformer, which is the ratio of the number of turns in the primary winding to the number of turns in the secondary winding. When adjacent turns of a transformer winding are shorted together, the portion of the winding that is between the two points of connection, i.e., the short, is effectively removed from the winding, thus reducing the effective number of turns in that winding. When this occurs in the secondary winding, the TTR is increased and when it occurs in the primary winding, the TTR is reduced.

For normal transformer testing during manufacturing and maintenance, the TTR is calculated by applying a known AC voltage on one winding, measuring the induced open-circuit voltage on the other winding, then calculating the ratio between them, generally expressed, for example, as 1200:120, where 1200 is the primary side voltage and 120 is the secondary side voltage. Since the TTR is constant over an applied voltage this test does not require a high voltage level in lab or service center testing. However, this method is not generally usable when a transformer is in service because of both safety issues resulting from the high voltages, and the practical lack of an open-circuit measurement on the load side of the transformer.

SUMMARY

The following discussion discloses and describes a transformer breakdown detection system for determining whether a distribution transformer has reached end-of-life, where the transformer includes a primary winding coupled to a medium voltage power line and a secondary winding providing a stepped down voltage of the medium voltage. The detection system includes a switching device, where the switching device includes a first voltage measuring device for measuring the voltage on the primary winding, a controller for processing measured voltages and a transceiver for receiving and transmitting messages. The detection system also includes a second voltage measuring device for measuring the stepped down voltage on the secondary winding, where the second voltage measuring device includes a transmitter for transmitting the measured step down voltage to the switching device. The controller uses the measured voltages to calculate a transformer turns ratio (TTR) of the transformer to determine whether a transformer fault.

Additional features of the disclosure will become apparent from the following description and appended claims, taken in conjunction with the accompanying drawings.

DETAILED DESCRIPTION OF THE EMBODIMENTS

Figure 1:
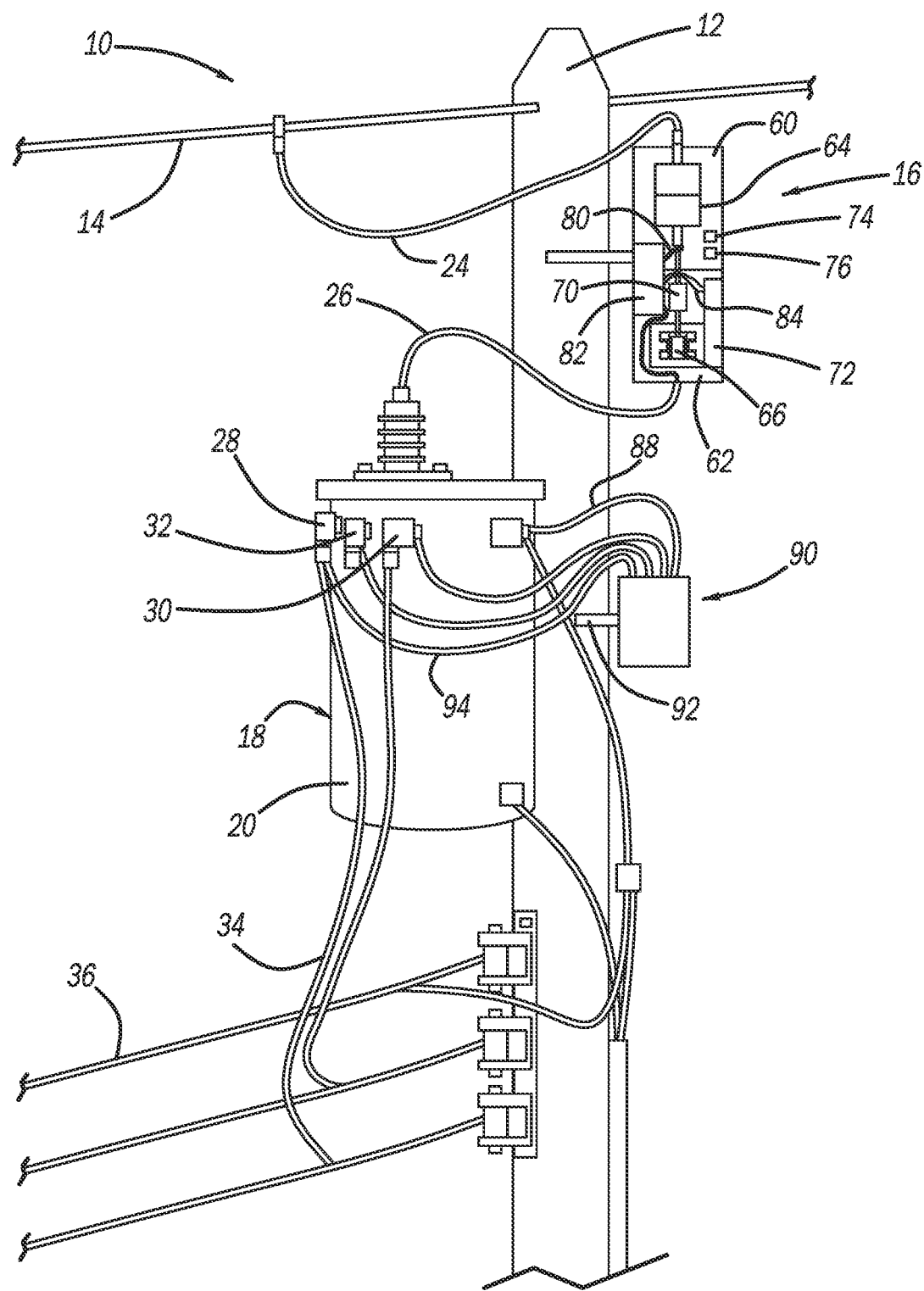
FIG. 1 is a schematic illustration of a transformer fault detection system.

The following discussion of the embodiments of the disclosure directed to a transformer fault detection system for determining whether a distribution transformer is reaching an end-of-life state is merely exemplary in nature, and is in no way intended to limit the disclosure or its applications or uses.

As will be discussed in detail below, this disclosure describes a transformer fault detection system that detects a breakdown in a transformer by measuring the primary side and secondary side voltages of the transformer at the same time, then calculating the transformer TTR, using, for example, the equation below. The calculated TTRs are stored and then new TTR calculations are compared to the stored TTR calculations and any changes in the calculated TTRs are detected that may indicate a potential transformer fault. These TTR changes can be communicated to a local control device for safe removal of the transformer from service, or communicated to a central control room to allow dispatch of a service crew to investigate the transformer and take appropriate action prior to a complete breakdown of the transformer.

$$TTR = \frac{Vprimary}{Vsecondary} \times \left(1 + \left(\left(\frac{Iprimary}{Irated}\right) * \% z\right)\right),$$

where Vprimary is the measured primary RMS voltage, Vsecondary is the measured secondary RMS voltage, Iprimary is the measured primary current, Irated is the rated nominal primary current and % z is the nameplate percent impedance, and where the primary current and the % impedance are used to adjust the TTR calculation for variance based on the load at the time the voltage measurements are taken.

The system provides breakdown detection by using the voltage measurements of the primary side of the transformer provided by an existing primary switching device connected to the primary side of the transformer, such as a cutout or cutout-mounted recloser, and a voltage measurement of the secondary side of the transformer provided by a secondary measuring device connected to the secondary side of the transformer, where the secondary measuring device wirelessly transmits its voltage measurements to the primary switching device. The secondary current measurement can be used to adjust for the effect of load current on the calculated TTR.

The switching device incorporates a voltage measurement system along with monitoring, data logging and wireless communications sub-systems, which are in common use in the utility, where such hardware requires only the addition of the voltage measurement to be applied in the manner described here. The measurement device is attached directly to the secondary terminals of the transformer, and can be very small, lightweight and low-cost, and can be mounted on the terminals of the transformer, or with a small bracket such as those used by small transient surge arrestors. The measurement device includes a 120/240 VAC power supply connected directly to the secondary terminals of the transformer, a voltage measurement system (divider, A/D conversion, minimal processor), and a short-range wireless communications.

The measurement device measures the secondary RMS voltage at regular intervals and broadcasts the measured value using a minimally complex wireless protocol. This voltage measurement is received by the switching device, and at which time the switching device takes similar measurements of the primary RMS voltage and the primary load current. The switching device then performs the TTR calculation and logs the calculated value. Periodically, the switching device will compare the logged values to detect a shift or trend in the TTR that would indicate a change in the number of effective turns in one or more of the windings within the transformer. If such a change is detected, a pre-determined action can be taken, such as sending a communications message to a central control center, proactively disconnecting the transformer, illuminating an error indicator, or other similar step to mitigate the potential damage of an uncontrolled transformer breakdown.

The transformer fault detection system can be implemented for single- or multi-phase transformers, or multi-phase banks of individual single-phase transformers, could be applied in line-line or line-neutral connections, and could be implemented with single- or three-phase switching devices for overhead or underground distribution systems. Additionally, various sensors could be added to the measurement device that could detect additional faults, included, but not limited to, a temperature sensor for providing correlation between local current and an oil or winding temperature rise, a pressure sensor for detecting an over-pressure event in an oil-filled transformer tank, which often is the result of an undesired arc, and a partial discharge sensor for detecting incipient bushing or insulation breakdown.

FIG. 1 is a schematic illustration of a transformer fault detection system 10 that depicts one non-limiting example of the detection system described above. In this non-limiting embodiment, the detection system 10 is provided on a utility pole 12 that supports a single-phase lateral line 14. The detection system 10 includes a smart switching device 16, such as a single-phase recloser or other switching device suitable for the purposes discussed here, and a distribution transformer 18 having an outer oil-filled can 20 that is metallic and usually electrically coupled to ground or neutral. The transformer 18 is electrically coupled to the lateral line 14 on its primary side through the switching device 16 by power lines 24 and 26. The transformer 18 steps down the medium voltage on the lateral line 14 on its secondary side to ±120 volts at hot terminals 28 and 30 relative to a neutral terminal 32 and that voltage is provided on lines 34 to be provided to power lines 36 that services loads (not shown), where the switching device 16 allows and prevents current flow from the line 14 to the loads for fault current protection.

Figure 2:
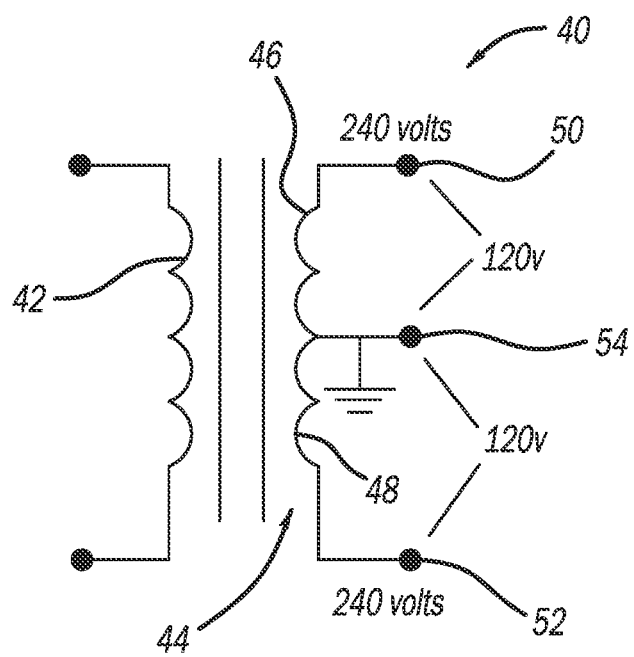
FIG. 2 is a schematic diagram of the transformer in the transformer fault detection system.

FIG. 2 is a schematic diagram of a transformer 40 that is representative of the transformer 18 having a primary winding 42 that would be electrically coupled to the power line 14 and a center tapped secondary winding 44 including coils 46 and 48, where a terminal 50 represents the terminal 28, a terminal 52 represents the terminal 30 and a terminal 54 represents the terminal 32.

The switching device 16 can be any switching device suitable for the purposes discussed herein that is capable of measuring the voltage provided on the line 14, receive a measurement of the voltage on the secondary winding 44 in the transformer 18 and calculate, store and compare TTR values. In this non-limiting embodiment, the switching device 16 includes an upper insulating housing 60 and a lower insulating housing 62. A vacuum interrupter 64 is provided in the upper housing 60 and is coupled to an actuator 66, such as a solenoid, in the lower housing 62 by a coupler 70. The actuator 66 is controlled by a controller 72 also located in the lower housing 62 to cause the actuator 66 to open and close the vacuum interrupter 64 to prevent or allow current flow to the transformer 18 for fault protection in a manner well understood by those skilled art. The switching device 16 also includes sensors 74 for measuring the current and voltage on the line 14 and the primary side of the transformer 18. The controller 72 processes the measurement signals and controls the position of the vacuum interrupter 64 for opening and closing the switching device 16. A transceiver 76 transmits data and messages to a control facility (not shown) and/or to other switch devices, reclosers and components, and receives the voltage measurements on the secondary winding 44. The controller 72 calculates the TTR values using the voltage measurements from the sensors 74 and the voltage measurements on the secondary winding 44, stores those values, and compares subsequent calculated TTR values to the stored values. When the vacuum interrupter 64 is closed current is provided on line 80 to a current transformer 82 that harvests power therefrom and provides power to the controller 72 on line 84.

The detection system 10 also includes a measuring device 90 mounted to the pole 12 by a bracket 92 that is electrically coupled to the terminals 28, 30 and 32 on lines 94 so that the measuring device 90 receives and measures the voltage on the secondary side of the transformer 18. A safety ground line 88 is connected between the transformer 18 and the measuring device 90.

Figure 3:
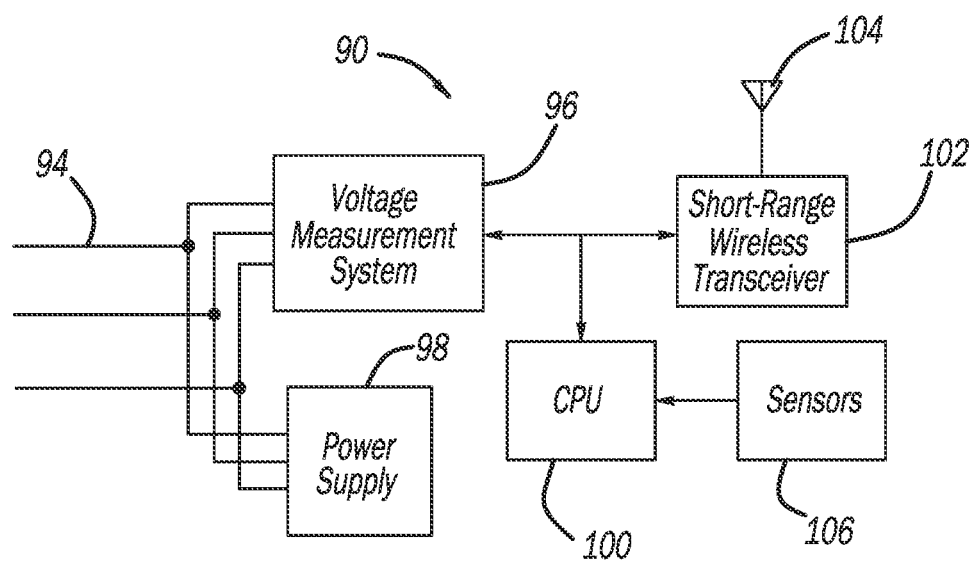
FIG. 3 is a schematic block diagram of a voltage measurement device in the transformer fault detection system.

FIG. 3 is a schematic block diagram of the measuring device 90 separated from the system 10 and illustrating the elements therein. The voltage signals on the lines 94 are provided to a voltage measurement system 96 and provide power for a power supply 98 that powers the device 90. The voltage measurement system 96 measures the voltage on the lines 94 and provides those measurements to a central processing unit (CPU) 100 that controls the operation of the device 90, such as providing timing and data collection. A wireless transceiver 102 sends the voltage measurement signals at predetermined time intervals through an antenna 104 to the transceiver 76 in the switching device 16, which are then provided to the controller 72. The controller 72 periodically calculates the TTR values as discussed above, and stores those values. If there is a short circuit in the primary winding 42, the voltage on the secondary side of the transformer 18 will slightly increase, which reduces the TTR value and when that TTR value is compared to the previous stored TTRs, the controller 72 sends a message indicating that there may be a transformer problem and the transformer 18 can then be serviced. Likewise, if there is a short circuit in the secondary winding 44, the voltage on the secondary side of the transformer 18 will significantly decrease, which increases the TTR value and when that TTR value is compared to the previous stored TTRs, the controller 72 sends a message indicating that there may be a transformer problem and the transformer 18 can then be serviced. In addition, the CPU 100 can compare the voltages on the coils 46 and 48 to determine if there may be a short in one of those coils 46 and 48 in the same manner. Particularly, the ratio of the voltage between the primary side terminals and the terminals 28 and 30 should remain constant, and if that ratio exceeds some threshold that could be an indication that there is a short in the winds 42 or 44. The CPU 100 will transmit that message to the controller 72, which will then transfer the message so that appropriate action can be taken.

The measuring device 90 could include various sensors 106 to enhance the fault detection capabilities of the system 10. For example, the device 90 could include a temperature sensor to provide correlation between the local current and a rise in oil or winding temperature, a pressure sensor for detecting an over-pressure event in the transformer 18, which often is the result of an undesired arc, and a partial discharge sensor for detecting bushing or insulation breakdown.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. A transformer fault detection system, the transformer including a primary winding coupled to a power line having a first voltage and a secondary winding providing a stepped down second voltage of the first voltage, the detection system comprising:
   a first voltage measuring device for measuring the first voltage on the primary winding;
   a second voltage measuring device for measuring the stepped down voltage on the secondary winding;
   a controller for determining whether a ratio between the measured voltages is changing over time, based on a transformer turns ratio (TTR), that would indicate a transformer fault;
   wherein the controller calculates the TTR of the transformer; and
   wherein the controller calculates the TTR of the transformer using the equation:
where Vprimary is the first measured voltage, Vsecondary is the second measured voltage, Iprimary is a measured primary current, Irated is a rated nominal primary current of the transformer and % z is percent impedance.

2. The detection system according to claim 1 wherein the controller periodically calculates the TTR of the transformer, stores the calculated TTRs and compares newly calculated TTRs to previously stored TTRs to determine whether the ratio between the measured voltages is changing over time.

3. The detection system according to claim 1 wherein the first voltage measuring device is part of a switching device that includes a switch for allowing and preventing current flow to the transformer.

4. The detection system according to claim 3 wherein the controller is also part of the switching device.

5. The detection system according to claim 4 wherein the second voltage measurement device is a separate unit from the switching device.

6. The detection system according to claim 5 wherein the second voltage measuring device includes a wireless transmitter for transmitting the measured stepped down voltage to the switching device.

7. The detection system according to claim 4 wherein the switching device and the second voltage measurement device are mounted to a utility pole.

8. The detection system according to claim 1 wherein the controller determines whether the primary winding or the secondary winding has a short circuit based on the ratio.

9. The detection system according to claim 1 further comprising a temperature sensor for measuring a temperature of the voltage measuring devices, a pressure sensor for detecting an over-pressure event in the transformer or a partial discharge sensor for detecting transformer bushing or insulation breakdowns.

10. The detection system according to claim 1 wherein the secondary winding is a center tap winding including a first coil and a second coil, said second voltage measuring device measuring the voltage on the first and second coils and comparing the measured voltages on the coils to determine if one of the coils is breaking down.

11. A transformer fault detection system, the transformer including a primary winding coupled to a medium voltage power line and a secondary winding providing a stepped down voltage of the medium voltage, the detection system comprising:
   a switching device mounted to a utility pole, said switching device including a first voltage measuring device for measuring the voltage on the primary winding, a controller for processing measured voltages and a transceiver for receiving and transmitting messages;
   a voltage measuring unit mounted to the utility pole separate from the switching device, said voltage measuring unit including a second voltage measuring device for measuring the stepped down voltage on the secondary winding, said second voltage measuring device further including a transmitter for transmitting the measured step down voltage to the switching device, said controller using the measured voltages to calculate a transformer turns ratio (TTR) of the transformer to determine whether a transformer fault is present; and
   wherein the controller calculates the TTR of the transformer using the equation:
where Vprimary is the first measured voltage, Vsecondary is the second measured voltage, Iprimary is a measured primary current, Irated is a rated nominal primary current of the transformer and % z is percent impedance.

12. The detection system according to claim 11 wherein the controller periodically calculates the TTR of the transformer, stores the calculated TTRs and compares newly calculated TTRs to previously stored TTRs to determine whether a ratio between the measured voltages is changing over time.

13. The detection system according to claim 11 wherein the controller determines whether the primary winding or the secondary winding has a short circuit based on the TTR.

14. The detection system according to claim 11 further comprising a temperature sensor for measuring a temperature of the voltage measuring devices, a pressure sensor for detecting an over-pressure event in the transformer or a partial discharge sensor for detecting transformer bushing or insulation breakdowns.

15. A method for determining a transformer fault in a power distribution network, the transformer including a primary winding coupled to a power line having a first voltage and a secondary winding providing a stepped down second voltage of the first voltage, said method comprising:
   measuring the first voltage on the primary winding;
   measuring the stepped down voltage on the secondary winding; and
   determining whether a ratio between the measured voltages is changing over time that would indicate a transformer fault;
   wherein determining whether the ratio is changing over time comprises includes determining a transformer turns ratio (TTR) of the transformer by calculating a TTR of the transformer using the equation:
where Vprimary is the first measured voltage, Vsecondary is the second measured voltage, Iprimary is a measured primary current, Irated is a rated nominal primary current of the transformer and % z is percent impedance.

16. The method according to claim 15 wherein determining a TTR of the transformer includes periodically calculating the TTR of the transformer, storing the calculated TTRs and comparing newly calculated TTRs to previously stored TTRs to determine whether the ratio between the measured voltages is changing over time.

* * * * *